United States Patent [19]

Stipanuk

[11] Patent Number: 4,703,458
[45] Date of Patent: Oct. 27, 1987

[54] CIRCUIT FOR WRITING BIPOLAR MEMORY CELLS

[75] Inventor: James J. Stipanuk, Chandler, Ariz.
[73] Assignee: Motorola, Inc., Schaumburg, Ill.
[21] Appl. No.: 809,540
[22] Filed: Dec. 16, 1985
[51] Int. Cl.$^4$ ............................................. G11C 7/00
[52] U.S. Cl. ................................... 365/189; 365/174
[58] Field of Search ............... 365/154, 155, 156, 189, 365/190, 179, 174

[56] References Cited

U.S. PATENT DOCUMENTS 4,625,299  11/1986  Isogai et al. ...................... 365/155

Primary Examiner—James W. Moffitt
Attorney, Agent, or Firm—William E. Koch

[57] ABSTRACT

A circuit for writing bipolar memory cells is provided that reduces power dissipation by requiring only a small voltage change on the bit lines between read and write modes. The memory circuit includes a first voltage terminal, a second voltage terminal, a plurality of word lines, a plurality of bit lines, and a plurality of memory cells, wherein the plurality of memory cells are arranged in a matrix of rows and columns. Each of the cells in a row are coupled between the first voltage terminal and a word line, and each of the cells in a column are coupled between a pair of the bit lines. A word line driver circuit is coupled between the first voltage terminal and one of the word lines of each of the rows for selectively applying voltage to the one of the word lines. A decoder circuit is coupled to the bit lines for enabling current through the bit lines. A current source is coupled between the second voltage terminal and each of the decoder circuits for sinking a read current through the bit lines of each column. A write current source is switchably coupled between the decoder circuits and the second voltage terminal for sinking a write current through the bit lines of each column.

3 Claims, 1 Drawing Figure

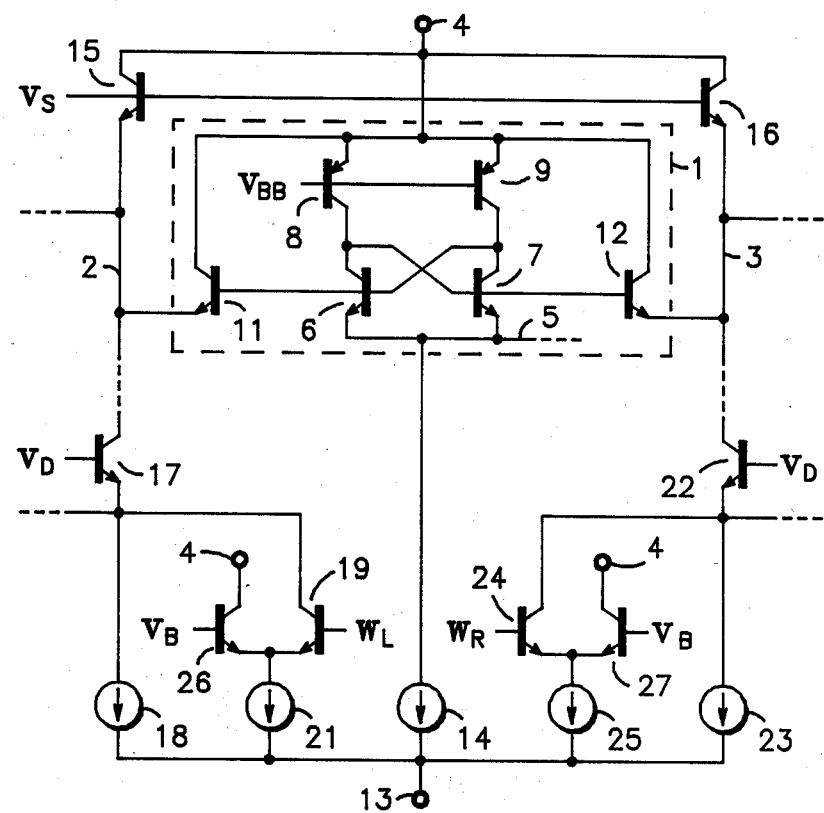

CIRCUIT FOR WRITING BIPOLAR MEMORY CELLS

FIELD OF THE INVENTION

This invention relates generally to memory cells and, more particularly, to a circuit for writing a bipolar memory cell that reduces power dissipation by requiring only a small voltage change on the bit lines between read and write modes.

BACKGROUND OF THE INVENTION

Memory cells are circuits wherein information may be stored in a low current stand-by mode and may be written or read in a higher current mode. A predetermined number of cells are located in a row between each of a plurality of upper and lower word lines and another predetermined number of cells are located in a column between a plurality of bit lines. In other words, each cell is uniquely coupled between a combination of word lines and bit lines.

Conventionally, a row of cells is selected when increased voltage is supplied to the upper word line. A particular cell in that row is read by a sense amplifier coupled to the bit lines. A first read current through one bit line flows directly from the sense amplifier. A second read current through the other bit line flows through one side of the memory cell from the upper word line. When a cell is written, the first read current is directed through the cell and the second read current is directed from the sense amplifier.

There are generally two types of previously known write circuits: single ended and differential. The single ended write circuit pulls down the base of a first sense amplifier device while the base of a second sense amplifier device remains at a read threshold with a read current flowing in the memory cell until it is almost fully written. The differential write circuit raises the base of the second sense amplifier device to remove the read current from the memory cell.

One previously known differential write circuit includes current sources coupled between the memory cell and ground by the bit lines. A first and a second decode transistor have their collector-emitter path coupled between the bit lines and the current sources, respectively, and are biased by a column decode circuit for steering write currents through the bit lines. A sense amplifier is coupled to the bit lines above the memory cell for sensing which side of the cell has been written. The read current for the "on" side of the memory cell goes to zero. The sense amplifier typically comprises a first and second transistor, each having an emitter connected to one of the bit lines for supplying current thereto, a base connected to a write circuit for biasing one of the first or second transistors during the write mode, and a collector connected to an emitter of a third and fourth transistor, respectively. The third and fourth transistor have their bases connected to a bias voltage and their collectors coupled to a first supply voltage terminal by a first and second resistor, respectively. The collectors of the third and fourth transistors are further connected to an output gate for providing an output signal.

The first and second transistors are biased by a voltage halfway between the voltage on the bases of the cross-coupled transistors designating the two sides of the memory cell (the "on" side of the cell will have a higher voltage on the base of the cross-coupled transistor). A read current applied to that bit line will flow through the cross-coupled transistor since its base is biased higher than the base of the first transistor. A read current applied to the other bit line (the "off" side) will flow through the second transistor since its base is biased higher than the base of the other cross-coupled transistor. To write the cell, the voltage on the base of either the first or second transistor is lowered so that the base voltage is lowered on the respective cross-coupled transistor, which will turn on the appropriate side.

However, the first and second transistor bases and the bit lines are highly capacitive, requiring a large current to discharge the bit lines and the first and second transistor bases during the write cycle.

Therefore, a write circuit is needed that reduces power dissipation by requiring only a small voltage change on the bit lines between read and write modes.

SUMMARY OF THE INVENTION

Accordingly, it is an object of the present invention to provide an improved write circuit for bipolar memory cells. Another object of the present invention is to provide a write circuit for bipolar memory cells that reduces power dissipation.

Yet another object of the present invention is to provide a write circuit for bipolar memory cells that requires only a small voltage change on the bit lines between read and write modes.

In carrying out the above and other objects of the invention in one form, there is provided an improved write circuit for an array of bipolar memory cells. The array of memory cell includes a first voltage terminal, a second voltage terminal, a plurality of word lines, and a plurality of bit lines, wherein the memory cells are arranged in rows and columns. Each of the cells in a row are coupled between the first voltage terminal and a word line, and each of the cells in a column are coupled between a pair of the bit lines, wherein each cell is uniquely coupled in a row and column. A word line driver circuit is coupled between one of the word lines of each of the rows and the first voltage terminal and for selectively applying voltage to the one of the word lines. A decoder circuit is coupled to the bit lines for enabling current through the bit lines. A current source is coupled between the second voltage terminal and each of the decoder circuits for sinking a read current through the bit lines of each column. A write current source is switchably coupled between the decoder circuits and the second voltage terminal for sinking a write current through the bit lines of each column.

The above and other objects, features, and advantages of the present invention will be better understood from the following detailed description taken in conjunction with the accompanying drawing.

BRIEF DESCRIPTION OF THE DRAWING

The single FIGURE is a schematic of the preferred embodiment of the invention.

DETAILED DESCRIPTION OF THE INVENTION

Referring to the single FIGURE, memory cell 1 is coupled between bit lines 2 and 3, and between supply voltage terminal 4 and word line 5. In actuality, a plurality of memory cells 1 are coupled in this manner as reflected by the dotted line for word line 5 and bit lines 2 and 3. There are many types of memory cells known in the art. Memory cell 1 may comprise several of these known cells and the invention described herein is not to be limited to the memory cell shown.

Memory cell 1 comprises latchable cross-coupled transistors 6 and 7 having their emitters connected to word line 5, and their collectors connected to each others base and to the collectors of load transistors 8 and 9, respectively. Transistors 8 and 9 have their emitters connected to supply voltage terminal 4 and their bases coupled for receiving bias voltage $V_{BB}$ for sourcing current to transistors 8 and 9. Bit line sense transistors 11 and 12 have their collectors connected to supply voltage terminal 4, their bases connected to the bases of transistors 6 and 7, respectively, and their emitters connected to bit lines 2 and 3, respectively. Word line 5 is coupled to supply voltage terminal 13 by current source 14 for sinking a stand-by current from word line 5.

Bit line clamp transistors 15 and 16 have their collectors connected to supply voltage terminal 4, their bases coupled for receiving sense voltage $V_S$, and their emitters connected to bit lines 2 and 3, respectively. Decode transistor 17 has a collector connected to bit line 2, a base coupled for receiving column decode signal $V_D$, and an emitter both coupled to supply voltage terminal 13 by read current source 18 and connected to the collector of write enable transistor 19. Transistor 19 has a base coupled for receiving write signal $W_L$, and an emitter coupled to supply voltage terminal 13 by current source 21. Decode transistor 22 has a collector connected to bit line 3, a base coupled for receiving column decode signal $V_D$, and an emitter both coupled to supply voltage terminal 13 by read current source 23 and connected to the collector of write enable transistor 24. Transistor 24 has a base coupled for receiving write signal $W_R$, and an emitter coupled to supply voltage terminal 13 by current source 25. Transistor 26 has an emitter connected to the emitter of transistor 19, a collector connected to terminal 4, and a base coupled for receiving voltage $V_B$. Transistor 27 has an emitter connected to the emitter of transistor 24, a collector connected to terminal 4, and a base coupled for receiving voltage $V_B$.

Bit line clamp transistors 15 and 16 are biased by the same sense voltage $V_S$, and are biased at a voltage half way between the voltage on the bases of transistors 11 and 12. In the read mode, assumining transistor 6 is on and transistor 7 is off, the bases of transistors 6 and 11 are high. Read current $I_R$ will flow through current source 18, transistor 17, and transistor 11 to supply voltage terminal 4. In the write mode, the voltage on the bases of transistors 15 and 16 does not need to be lowered. By switching write current $I_W$ from current source 21 by applying write signal $W_L$ to transistor 19, then the current at the base of transistor 11 overcomes the collector current of transistor 9. This pulls that side low, thereby allowing transistor 8 to charge the other side.

By now it should be appreciated that there has been provided a circuit for writing a bipolar memory cell that reduces power dissipation by requiring only a small voltage change on the bit lines between read and write modes.

I claim:

1. A memory circuit including a first voltage terminal and a second terminal, said memory circuit comprising:
   a plurality of bit lines;
   a plurality of word lines;
   a plurality of first means, each of said first means coupled to one of said word lines for selectively applying voltage to said one of said word lines;
   a plurality of second means, each of said second means coupled between said one of said word lines and said second voltage terminal for sinking current from said one of said word lines;
   a plurality of third means, each of said third means coupled to a pair of said bit lines for enabling current through said bit lines;
   a plurality of fourth means, each of said fourth means coupled between said second voltage terminal and each of said third means for sinking a read current through said pair of said bit lines;
   a plurality of fifth means, each of said fifth means coupled between one of said third means and said second voltage terminal for selectively sinking a write current; and
   a plurality of memory cells, wherein said memory cells are arranged in a matrix of rows and columns, each of said memory cells in a row coupled between said first voltage terminal and one of said word lines, each of said memory cells in a column coupled between a pair of said bit lines, said memory cells comprising:
   a first load;
   a second load;
   a pair of latchable cross-coupled transistors having their collectors coupled to one of said word lines, their emitters coupled to said first supply voltage terminal by said first and second loads, respectively, and their bases coupled to each other's emitter;
   sixth means coupled between said first voltage terminal and said first bit line and coupled to said base of one of said pair of latchable cross-coupled transistors for sinking current from said base of said one of said pair of latchable cross-coupled transistors; and
   seventh means coupled between said first voltage terminal and said second bit line and coupled to said base of the other of said pair of latchable cross-coupled transistors for sinking current from said base of the other of said pair of latchable cross-coupled transistors.

2. The circuit according to claim 1 wherein said sixth and seventh means comprise a second transistor and a third transistor, each having a collector coupled to said first supply voltage terminal, an emitter coupled to said first and second bit lines, respectively, and a base coupled to said base of one of said pair of latchable cross-coupled transistors.

3. The circuit according to claim 2 wherein said first and second loads comprise a fourth and fifth transistor, each having an emitter coupled to said first supply voltage terminal, a base coupled to receive a bias voltage, and a collector coupled to the base of the other of said pair of latchable cross-coupled transistors.

* * * * *